(12) United States Patent
Liu et al.

(10) Patent No.: US 9,650,712 B2
(45) Date of Patent: May 16, 2017

(54) INTER-ANCHORED MULTILAYER REFRACTORY COATINGS

(71) Applicant: Kennametal Inc., Latrobe, PA (US)

(72) Inventors: Zhenyu Liu, Greensburg, PA (US); Yixiong Liu, Greensburg, PA (US)

(73) Assignee: KENNAMETAL INC., Latrobe, PA (US)

( * ) Notice: Subject to any disclaimer, the term of this patent is extended or adjusted under 35 U.S.C. 154(b) by 172 days.

(21) Appl. No.: 14/563,692

(22) Filed: Dec. 8, 2014

(65) Prior Publication Data

US 2016/0160346 A1   Jun. 9, 2016

(51) Int. Cl.
| | |
|---|---|
| *C23C 16/34* | (2006.01) |
| *C23C 16/40* | (2006.01) |
| *C23C 28/04* | (2006.01) |
| *C23C 28/00* | (2006.01) |

(52) U.S. Cl.
CPC .......... *C23C 16/34* (2013.01); *C23C 16/403* (2013.01); *C23C 28/042* (2013.01); *C23C 28/42* (2013.01)

(58) Field of Classification Search
USPC .......... 51/307, 309; 428/216, 325, 336, 697, 428/698, 699, 701, 702
See application file for complete search history.

(56) References Cited

U.S. PATENT DOCUMENTS

| | | | |
|---|---|---|---|
| 4,112,148 A | 9/1978 | Fonzi | |
| 4,180,400 A | 12/1979 | Smith et al. | |
| 4,576,836 A | 3/1986 | Colmet et al. | |
| 4,701,384 A | 10/1987 | Sarin et al. | |
| 4,702,970 A | 10/1987 | Sarin et al. | |
| 4,745,010 A | 5/1988 | Sarin et al. | |
| 4,746,563 A | 5/1988 | Nakano et al. | |
| 4,749,629 A | 6/1988 | Sarin et al. | |
| 4,751,109 A | 6/1988 | Sarin et al. | |
| 4,844,951 A | 7/1989 | Sarin et al. | |

(Continued)

FOREIGN PATENT DOCUMENTS

| | | |
|---|---|---|
| CN | 102581324 A | 7/2012 |
| DE | 2736982 A1 | 3/1979 |

(Continued)

OTHER PUBLICATIONS

X. Feng et al., "Converting Ceria Polyhedral Nanoparticles into Single-Crystal Nanospheres", Science Magazine, vol. 312, Jun. 9, 2006, pp. 1504-1508.

(Continued)

*Primary Examiner* — Archene Turner
(74) *Attorney, Agent, or Firm* — Larry R. Meenan (57) ABSTRACT

In one aspect, articles are described herein comprising refractory coatings employing an inter-anchored multilayer architecture. Articles having refractory coatings described herein, in some embodiments, are suitable for high wear and/or abrasion applications such as metal cutting operations. A coated article described herein comprises a substrate and a coating deposited by CVD adhered to the substrate, the coating including a refractory layer comprising a plurality of sublayer groups, a sublayer group comprising a Group IVB metal nitride sublayer and an adjacent layer alumina sublayer, the Group IVB metal nitride sublayer comprising a plurality of nodules interfacing with the alumina sublayer.

21 Claims, 5 Drawing Sheets

(56) References Cited

U.S. PATENT DOCUMENTS

| | | | |
|---|---|---|---|
| 4,984,940 A * | 1/1991 | Bryant | B23B 27/145 |
| | | | 51/309 |
| 5,310,607 A | 5/1994 | Schulz et al. | |
| 5,447,804 A | 9/1995 | Schulz et al. | |
| 5,693,417 A * | 12/1997 | Goedicke | C23C 14/0036 |
| | | | 428/702 |
| 5,770,261 A | 6/1998 | Nakamura et al. | |
| 5,827,570 A | 10/1998 | Russell | |
| 5,871,850 A | 2/1999 | Moriguchi et al. | |
| 5,879,823 A | 3/1999 | Prizzi et al. | |
| 5,972,495 A | 10/1999 | Ishii et al. | |
| 5,985,427 A | 11/1999 | Ueda et al. | |
| 6,156,383 A | 12/2000 | Ishii et al. | |
| 6,183,846 B1 | 2/2001 | Moriguchi et al. | |
| 6,333,103 B1 | 12/2001 | Ishii et al. | |
| 6,426,137 B1 | 7/2002 | Oshika et al. | |
| 6,436,519 B2 | 8/2002 | Holzschuh | |
| 6,599,062 B1 | 7/2003 | Oles et al. | |
| 6,641,939 B1 | 11/2003 | Lee et al. | |
| 6,660,371 B1 | 12/2003 | Westphal et al. | |
| 6,689,422 B1 | 2/2004 | Warnes et al. | |
| 6,689,450 B2 * | 2/2004 | Ruppi | C23C 16/36 |
| | | | 428/701 |
| 6,713,172 B2 | 3/2004 | Ljungberg et al. | |
| 6,726,987 B2 | 4/2004 | Kathrein et al. | |
| 6,756,111 B1 | 6/2004 | Okada et al. | |
| 6,805,944 B2 * | 10/2004 | Oshika | C23C 30/005 |
| | | | 51/307 |
| 6,849,132 B2 | 2/2005 | Warnes et al. | |
| 6,869,668 B2 | 3/2005 | Martensson | |
| 6,902,764 B2 | 6/2005 | Ljungberg et al. | |
| 7,011,867 B2 | 3/2006 | Martensson | |
| 7,090,914 B2 | 8/2006 | Yamagata et al. | |
| 7,094,447 B2 | 8/2006 | Ruppi | |
| 7,163,735 B2 | 1/2007 | Ruppi | |
| 7,241,492 B2 | 7/2007 | Kohara et al. | |
| 7,273,665 B2 | 9/2007 | Hayahi et al. | |
| 7,276,301 B2 | 10/2007 | Tsushima et al. | |
| 7,326,461 B2 | 2/2008 | Sottke et al. | |
| 7,378,158 B2 | 5/2008 | Richter et al. | |
| 7,396,371 B2 * | 7/2008 | Cedergren | C22C 29/08 |
| | | | 428/698 |
| 7,396,581 B2 | 7/2008 | Ruppi | |
| 7,410,707 B2 | 8/2008 | Fukui et al. | |
| 7,416,778 B2 | 8/2008 | Westergren et al. | |
| 7,442,433 B2 | 10/2008 | Honma et al. | |
| 7,498,089 B2 | 3/2009 | Omori et al. | |
| 7,531,212 B2 | 5/2009 | Kohara et al. | |
| 7,531,213 B2 | 5/2009 | Bjormander | |
| 7,597,511 B2 | 10/2009 | Tomita et al. | |
| 7,597,951 B2 | 10/2009 | Bjormander et al. | |
| 7,597,970 B2 | 10/2009 | Fukano et al. | |
| 7,691,496 B2 | 4/2010 | Park et al. | |
| 7,803,464 B2 | 9/2010 | Okada et al. | |
| 7,820,310 B2 | 10/2010 | Bjormander | |
| 7,887,935 B2 * | 2/2011 | Elkouby | C23C 16/0272 |
| | | | 428/699 |
| 7,901,788 B2 | 3/2011 | Warnes et al. | |
| 7,906,230 B2 | 3/2011 | Watanabe et al. | |
| 7,923,101 B2 | 4/2011 | Ruppi | |
| 7,928,028 B2 | 4/2011 | Nawa et al. | |
| 7,939,181 B2 | 5/2011 | Ramm et al. | |
| 7,967,533 B2 | 6/2011 | Omori et al. | |
| 7,968,182 B2 | 6/2011 | Trinh et al. | |
| 7,972,714 B2 | 7/2011 | Okada et al. | |
| 8,012,611 B2 | 9/2011 | Okada et al. | |
| 8,025,991 B2 | 9/2011 | Schier | |
| 8,071,211 B2 | 12/2011 | Koike et al. | |
| 8,080,312 B2 | 12/2011 | McNerny et al. | |
| 8,097,332 B2 | 1/2012 | Omori et al. | |
| 8,119,226 B2 | 2/2012 | Reineck et al. | |
| 8,119,227 B2 | 2/2012 | Reineck et al. | |
| 8,129,040 B2 | 3/2012 | Quinto et al. | |
| 8,152,971 B2 | 4/2012 | Quinto et al. | |
| 8,221,838 B2 | 7/2012 | Gates, Jr. et al. | |
| 8,288,019 B2 | 10/2012 | Nagano et al. | |
| 2001/0006724 A1 | 7/2001 | Holzschuh | |
| 2001/0016273 A1 * | 8/2001 | Narasimhan | C23C 16/0209 |
| | | | 428/699 |
| 2002/0114945 A1 | 8/2002 | Greenberg et al. | |
| 2006/0029813 A1 | 2/2006 | Kutilek et al. | |
| 2007/0289280 A1 | 12/2007 | Marquardt | |
| 2012/0003452 A1 | 1/2012 | Tomita et al. | |

FOREIGN PATENT DOCUMENTS

| | | | |
|---|---|---|---|
| JP | 56152962 A | 11/1981 | |
| JP | 57158372 A | 9/1982 | |
| JP | 5921586 A | 2/1984 | |
| JP | 5985860 A | 5/1984 | |
| JP | 0516031 A | 1/1993 | |
| JP | 4195518 B2 | 7/1998 | |
| JP | 4019244 B2 | 6/2002 | |
| JP | 2003039207 | 2/2003 | |
| JP | 2006219739 A | 8/2006 | |
| JP | 4645983 B2 | 10/2006 | |
| JP | 2006289556 A | 10/2006 | |
| JP | 2008019489 A | 1/2008 | |
| JP | 2008019498 A | 1/2008 | |
| JP | 4822120 B2 | 2/2008 | |
| JP | 5019255 B2 | 1/2009 | |
| JP | 5099490 B2 | 4/2009 | |
| JP | 5099500 B2 | 7/2009 | |
| JP | 2011057529 A | 3/2011 | |
| JP | 2011127165 A | 6/2011 | |
| JP | 2011184295 A | 9/2011 | |
| JP | 2012143825 A | 8/2012 | |
| WO | 99/29920 | * | 6/1999 |

OTHER PUBLICATIONS

Z. Yu et al., "Atomic-resolution observation of Hf-doped alumina grain boundaries", SciVerse ScienceDirect, Scripta Materialia 68 (2013) pp. 703-706.

N. Shibata et al., "Atomic-scale imaging of individual dopant atoms in a buried interface", Nature Materials, vol. 8, 2009, pp. 654-658.

J. P. Buban et al., "Grain Boundary Strengthening in Alumina by Rare Earth Impurities", Science Magazine, vol. 311, Jan. 13, 2006, pp. 212-215.

Z. Li et al., "Nanodomain formation and distribution in Gd-doped ceria", SciVerse ScienceDirect, Materials Research Bulletin 47 (2012) pp. 763-767.

C. Bjormander, "CVD deposition and characterization of coloured Al2O3/ZrO2 multilayers", ScienceDirect, Surface & Coatings Technology 201 (2006) pp. 4032-4036.

D. Hochauer et al., "Titanium doped CVD alumina coatings", ScienceDirect, Surface & Coatings Technology 203 (2008) pp. 350-356.

W. C. Russell et al., "Wear Characteristics and Performance of Composite Alumina-Zirconia CVD Coatings*", Int. J. of Refractory Metals & Hard Materials 14 (1996) pp. 51-58.

S. Taylor, "Grain Boundary Structure and Solute Segregation in Titanium-Doped Sapphire Bicrystals", Disseeration, University of California, Berkley, Spring 2002, pp. 1-222.

* cited by examiner

INTER-ANCHORED MULTILAYER REFRACTORY COATINGS

FIELD

The present invention relates to refractory coatings and, in particular, to refractory coatings deposited by chemical vapor deposition (CVD) for cutting tool applications.

BACKGROUND

Cutting tools, including cemented carbide cutting tools, have been used in both coated and uncoated conditions for machining various metals and alloys. In order to increase cutting tool wear resistance, performance and lifetime, one or more layers of refractory material have been applied to cutting tool surfaces. TiC, TiCN, TiN and/or $Al_2O_3$, for example, have been applied to cemented carbide substrates by CVD and by physical vapor deposition (PVD). While effective in inhibiting wear and extending tool lifetime in a variety of applications, refractory coatings based on single or multi-layer constructions of the foregoing refractory materials have increasingly reached their performance limits, thereby calling for the development of new coating architectures for cutting tools.

SUMMARY

In one aspect, articles are described herein comprising refractory coatings employing an inter-anchored multilayer architecture. Briefly, a coated article described herein comprises a substrate and a coating deposited by CVD adhered to the substrate, the coating including a refractory layer comprising a plurality of sublayer groups, a sublayer group comprising a Group IVB metal nitride sublayer and an adjacent layer alumina sublayer, the Group IVB metal nitride sublayer comprising a plurality of nodules interfacing with the alumina sublayer. In some embodiments, the Group IVB metal nitride sublayer and the adjacent alumina sublayer of a sublayer group are nanolayers. Moreover, the coating can also comprise one or more inner layers between the refractory layer and the substrate. Further, the coating can comprise one or more outer layers over the refractory layer.

These and other embodiments are described further in the detailed description which follows.

BRIEF DESCRIPTION OF THE DRAWINGS

FIG. 5(*a*) is a plan view SEM image of an alumina sublayer surface of a sublayer group according to one embodiment described herein, and FIG. 5(*b*) is a plan view SEM image of a prior CVD alumina surface.

DETAILED DESCRIPTION

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

In one aspect, articles are described herein comprising refractory coatings employing an inter-anchored multilayer architecture. Articles having refractory coatings described herein, in some embodiments, are suitable for high wear and/or abrasion applications such as metal cutting operations. A coated article described herein comprises a substrate and a coating deposited by CVD adhered to the substrate, the coating including a refractory layer comprising a plurality of sublayer groups, a sublayer group comprising a Group IVB metal nitride sublayer and an adjacent layer alumina sublayer, the Group IVB metal nitride sublayer comprising a plurality of nodules interfacing with the alumina sublayer. In some embodiments, the Group IVB metal nitride sublayer and the adjacent alumina sublayer of a sublayer group are nanolayers. Moreover, the coating can also comprise one or more inner layers between the refractory layer and the substrate. Further, the coating can comprise one or more outer layers over the refractory layer.

Turning now to specific components, coated articles described herein comprise a substrate. A coated article can comprise any substrate not inconsistent with the objectives of the present invention. For example, a substrate can be a cutting tool or tooling used in wear applications. Cutting tools include, but are not limited to, indexable cutting inserts, end mills or drills. Indexable cutting inserts can have any desired ANSI standard geometry for milling or turning applications. Substrates of coated articles described herein can be formed of cemented carbide, carbide, ceramic, cermet or steel. A cemented carbide substrate, in some embodiments, comprises tungsten carbide (WC). WC can be present in a cutting tool substrate in an amount of at least about 80 weight percent or in an amount of at least about 85 weight percent. Additionally, metallic binder of cemented carbide can comprise cobalt or cobalt alloy. Cobalt, for example, can be present in a cemented carbide substrate in an amount ranging from 1 weight percent to 15 weight percent. In some embodiments, cobalt is present in a cemented carbide substrate in an amount ranging from 5-12 weight percent or from 6-10 weight percent. Further, a cemented carbide substrate may exhibit a zone of binder enrichment beginning at and extending inwardly from the surface of the substrate.

Cemented carbide substrates can also comprise one or more additives such as, for example, one or more of the following elements and/or their compounds: titanium, niobium, vanadium, tantalum, chromium, zirconium and/or hafnium. In some embodiments, titanium, niobium, vanadium, tantalum, chromium, zirconium and/or hafnium form solid solution carbides with WC of the substrate. In such embodiments, the substrate can comprise one or more solid solution carbides in an amount ranging from 0.1-5 weight percent. Additionally, a cemented carbide substrate can comprise nitrogen.

Figure 1:
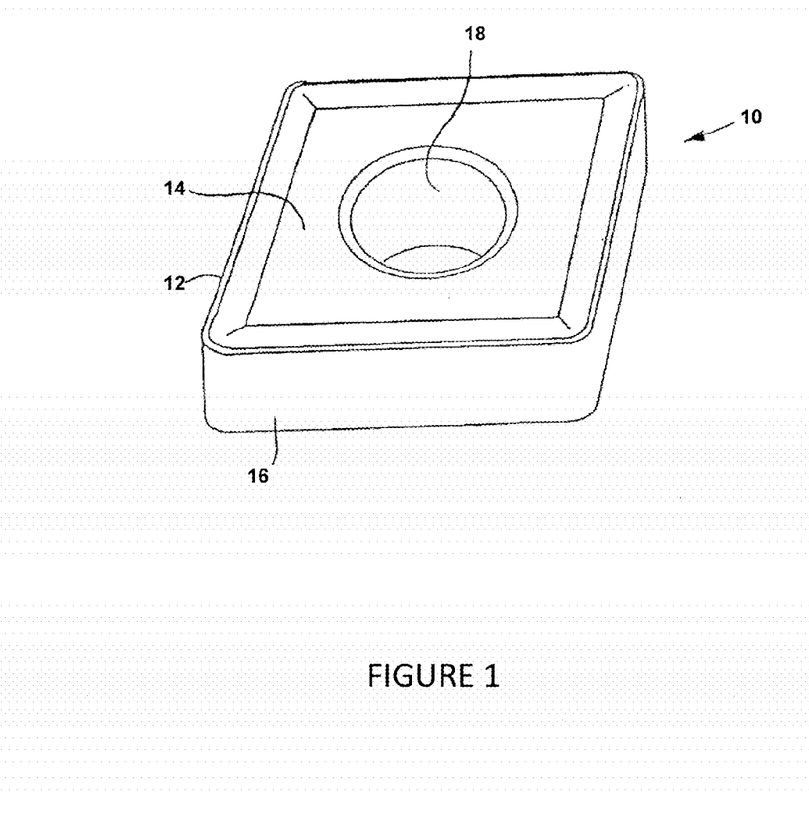
FIG. 1 illustrates a cutting tool substrate according to one embodiment described herein.

A cutting tool substrate can comprise one or more cutting edges formed at the juncture of a rake face and flank face(s) of the substrate. FIG. 1 illustrates a cutting insert substrate according to one embodiment described herein. As illustrated in FIG. 1, the substrate (10) has cutting edges (12) formed at junctions of the substrate rake face (14) and flank faces (16). The substrate (10) also comprises an aperture (18) for securing the substrate (10) to a tool holder.

As described herein, a coating adhered to the substrate includes a refractory layer deposited by CVD comprising a plurality of sublayer groups, a sublayer group comprising a Group IVB metal nitride sublayer and an adjacent alumina sublayer, the Group IVB metal nitride sublayer comprising a plurality of nodules interfacing with the alumina sublayer. Sublayer groups of the refractory layer can be adjacent to another or spaced apart from one another by intervening layer(s) in the refractory layer. Further, any desired number of sublayer groups can form the refractory layer. For example, a refractory layer can comprise 4 to 100 sublayer groups.

Figure 2:
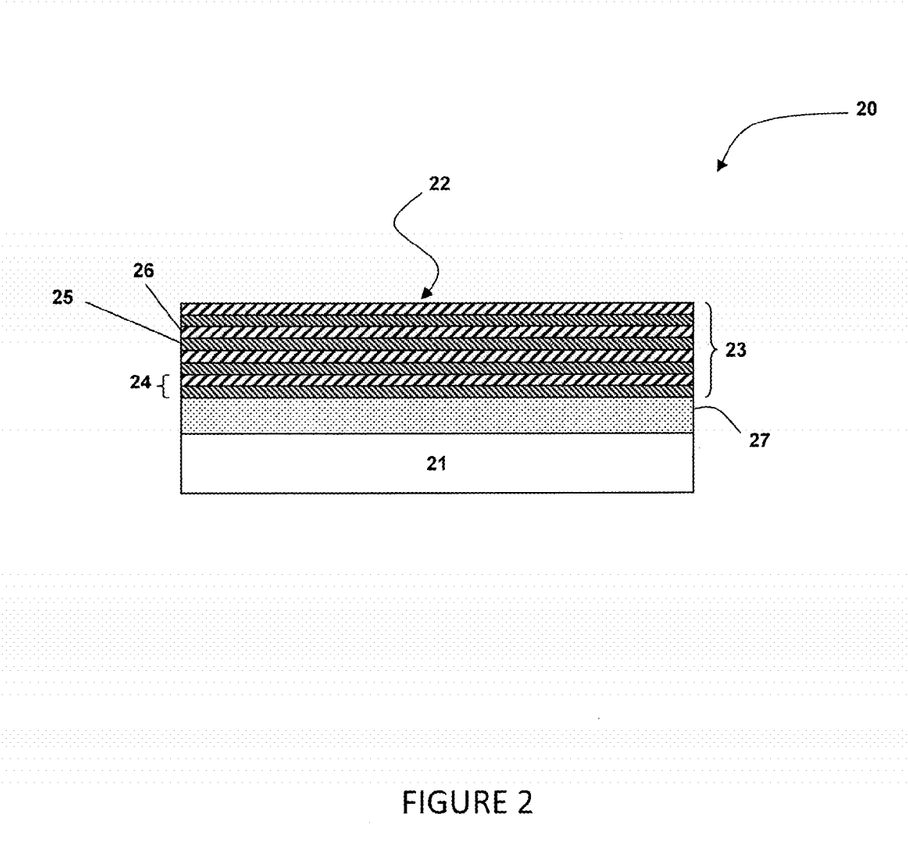
FIG. 2 illustrates a schematic cross-section of a coated cutting tool according to one embodiment described herein.

FIG. 2 illustrates a schematic of a coated cutting tool according to one embodiment wherein the refractory layer is deposited on an inner layer of the coating. The coated cutting tool (20) of FIG. 2 comprises a cutting tool substrate (21) and a coating (22) adhered to the substrate (21). The coating (22) comprises a refractory layer (23) having a plurality of sublayer groups (24). For ease of illustration in FIG. 2, the refractory layer (23) is formed of four sublayer groups (24), each sublayer group (24) comprising an alumina sublayer (25) and a Group IVB metal nitride sublayer (26), the Group IVB metal nitride sublayer (26) having nodules for interfacing with the alumina sublayer (25). Any number of sublayer groups (24) can be employed in the refractory layer (23) depending on desired thickness of the refractory layer (23) and/or other performance factors. An inner layer (27) of the coating is positioned between the refractory layer (23) and the cutting tool substrate (21). As described further herein, the inner layer (27) can be a single layer or multiple layers.

Individual sublayer groups can exhibit various constructions along the thickness of the refractory layer. Generally, the Group IVB metal nitride sublayer of a sublayer group is a nanolayer having a thickness less than 100 nm. The Group IVB metal nitride sublayer, for example, can have a thickness selected from Table I.

TABLE 1

Group IVB Metal Nitride Sublayer Thickness

| ≤100 nm |
| ≤50 nm |
| 3 nm-100 nm |
| 5 nm-80 nm |
| 10 nm-70 nm |

Importantly, the Group IV metal nitride sublayer comprises a plurality of nodules for interfacing with the adjacent alumina sublayer of the sublayer group. The nodules can exhibit a generally spherical shape, elliptical shape or irregular shape. In some embodiments, nodule shape varies within a single Group IVB metal nitride sublayer. Additionally, nodule shape can vary across Group IVB metal nitride sublayers of independent sublayer groups. Nodules of a Group IVB metal nitride sublayer can generally have sizes less than 1 µm. In some embodiments, nodules have a size selected from Table II.

TABLE II

Nodule Size of Group IVB Metal Nitride Sublayer

| 20 nm-500 nm |
| 50 nm-500 nm |

TABLE II-continued

Nodule Size of Group IVB Metal Nitride Sublayer

| 75 nm-350 nm |
| 100 nm-400 nm |
| 100 nm-200 nm |
| 25 nm-300 nm |

Figure 3:
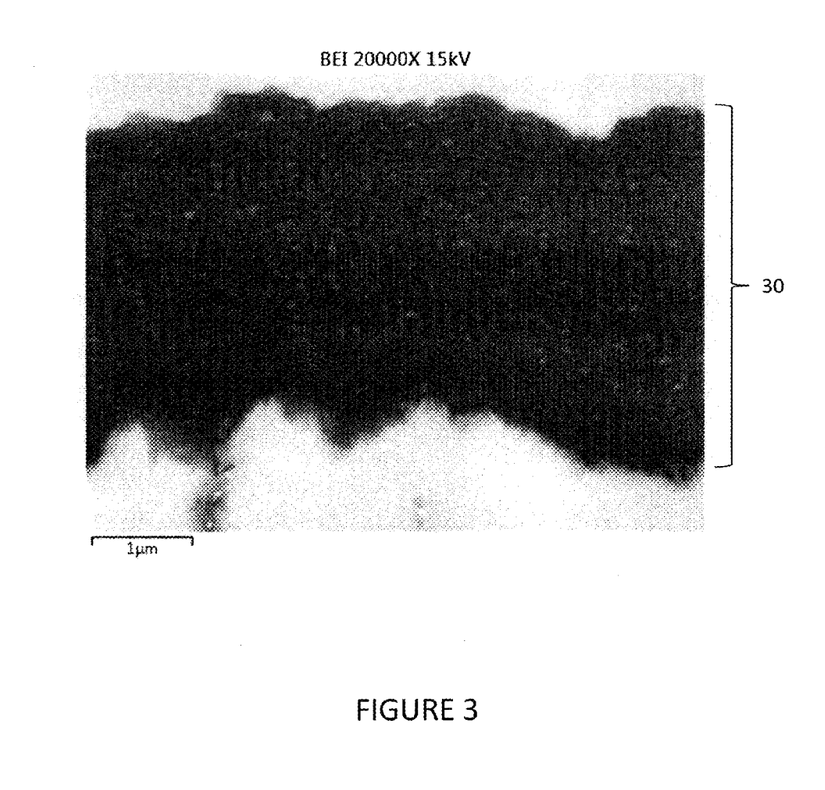
FIG. 3 is a cross-sectional scanning electron microscopy (SEM) image of a refractory layer according to one embodiment described herein.
Figure 4:
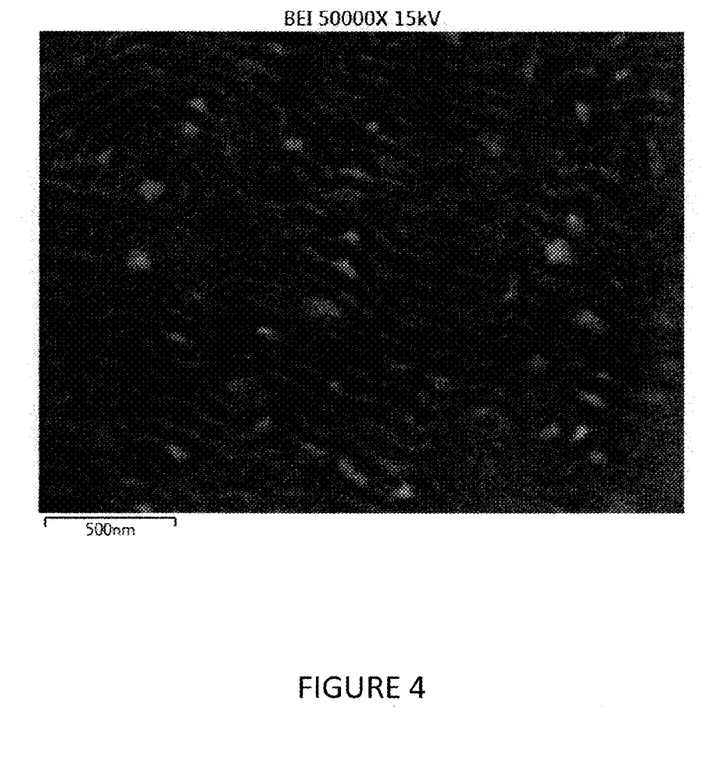
FIG. 4 is a SEM image of a section of the refractory layer provided in FIG. 3.

Further, the nodules can be dispersed over surfaces of the Group IVB metal nitride sublayer. Moreover, the nodules can be present on one or both sides of the Group IVB metal nitride sublayer of a sublayer group. When present on both sides of the Group IVB metal nitride sublayer, the nodules can interface with alumina sublayers of adjacent sublayer groups. Nodules of the Group IVB metal nitride sublayer can assist in anchoring the laminated structure formed by the multiple sublayer groups, leading to performance enhancements of the refractory layer. FIG. 3 is a cross-sectional back-scattering SEM image taken at a magnification of 20,000× of a refractory layer formed according to the CVD parameters set forth in Example 1 below. The refractory layer (30) is formed of a plurality of sublayer groups, each sublayer group comprising a TiN sublayer (white) and adjacent alumina sublayer (black). As illustrated by the SEM image, the TiN sublayers comprise nodules interfacing with the adjacent alumina sublayers. The nodules exhibit various regular and irregular morphologies as white specs throughout the refractory layer. FIG. 4 provides an SEM image of a section of the refractory layer detailed in FIG. 3. The SEM image of FIG. 4 was taken at a magnification of 50,000×. TiN nodules are clearly evidenced in FIG. 4 and extend across both surfaces of the TiN sublayers, providing resistance to delamination and improving refractory layer properties at high temperatures, such as those often encountered in cutting operations.

Nodules of the Group IVB metal nitride sublayer can be formed during CVD of the nitride sublayer by one or a combination of pathways. In some embodiments, for example, flow of the Group IVB metal reactant gas can be ramped to precipitate non-uniform growth of the Group IVB metal nitride sublayer leading to nodule formation in the layer. Further, the sudden change in deposition environment from alumina to Group IVB metal nitride, such as TiN, can result in nucleation of larger Group IVB metal nitride grains, thereby providing nodules. Further, Group IVB metal nitride grains can aggregate during deposition forming the nodules. CVD deposition conditions described further herein can be chosen to effectuate one or more of these pathways of nodule formation.

As sublayer groups can be formed independent of one another, the Group IVB metal can be the same or vary among the sublayer groups forming the refractory layer. When varied, the Group IVB metals can present any desired pattern such as alternating or periodic distribution along the cross-sectional thickness of the refractory layer. Alternatively, the Group IVB metals can exhibit a random distribution.

The adjacent alumina sublayer of a sublayer group can also be a nanolayer, having a thickness less than 0.5 µm. In some embodiments, an alumina sublayer has a thickness selected from Table III.

TABLE III

| Alumina Sublayer Thickness |
| --- |
| ≤250 nm |
| ≤100 nm |
| 10 nm-200 nm |
| 5 nm-100 nm |
| 20 nm-80 nm |

Figure 5:
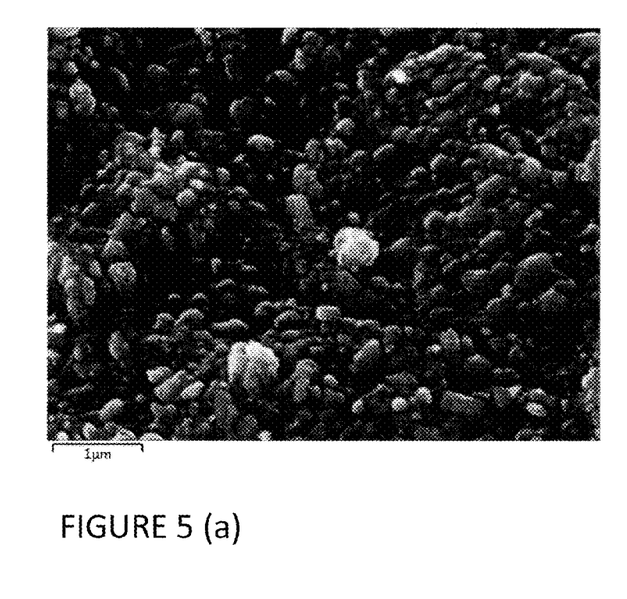

Moreover, an alumina sublayer of a sublayer group can have an average grain size less than 200 nm. In some embodiments, average alumina grain size ranges from 5 nm to 100 nm or 20 nm to 80 nm. FIG. 5(a) is a plan view SEM image of an alumina sublayer, according to one embodiment, illustrating morphology and submicron or nano-size of the alumina grains. This submicron size and morphology contrast sharply with prior CVD alumina grains provided in the SEM image of FIG. 5(b). Thickness and average grain size of the alumina sublayer is controlled by the intervening deposition of the Group IVB metal nitride sublayer. For example, such intervening deposition can terminate alumina sublayer growth and require renucleation of successive alumina sublayer(s). Depending on deposition conditions, an alumina sublayer can be α-alumina, κ-alumina or mixtures (α/κ) thereof. Additionally, in some embodiments, Group IVB metal can be present in the adjacent alumina sublayer, forming doped alumina phases such as $TiAl_2O_3$ and/or $ZrAl_2O_3$. As set forth in the CVD parameters described herein, transitioning between Group IVB metal nitride sublayer and alumina sublayer can permit introduction of Group IVB metal dopant into the alumina sublayer. Doped alumina phases can generally exist at or proximate interfaces with Group IVB metal nitride sublayers.

The refractory layer comprising the plurality of sublayer groups, in some embodiments, is deposited directly on the substrate surface. Alternatively, a coating described herein can further comprise one or more inner layers between the refractory layer and the substrate. Inner layer(s), in some embodiments, comprise one or more metallic elements selected from the group consisting of aluminum and metallic elements of Groups IVB, VB and VIB of the Periodic Table and one or more non-metallic elements selected from Groups IIIA, IVA, VA and VIA of the Periodic Table. In some embodiments, one or more inner layers between the substrate and refractory layer comprise a carbide, nitride, carbonitride, oxycarbonitride, oxide or boride of one or more metallic elements selected from the group consisting of aluminum and metallic elements of Groups IVB, VB and VIB of the Periodic Table.

For example, one or more inner layers are selected from the group consisting of titanium nitride, titanium carbonitride, titanium oxycarbonitride, titanium carbide, zirconium nitride, zirconium carbonitride, hafnium nitride and hafnium carbonitride. Further, a layer of titanium oxycarbonitride can be employed as a bonding layer for the refractory layer and inner layers of the coating. Inner layer(s) of the coating can have any thickness not inconsistent with the objectives of the present invention. In some embodiments, a single inner layer can have a thickness of at least 5 µm. Alternatively, a plurality of inner layers can collectively achieve thickness of at least 5 µm. CVD of the refractory layer directly on the substrate or on an inner layer can begin with an alumina sublayer or Group IVB metal nitride sublayer.

The refractory layer comprising the plurality of sublayer groups can be the outermost layer of the coating. Alternatively, a coating described herein can comprise one or more outer layers over the refractory layer. Outer layer(s) can comprise one or more metallic elements selected from the group consisting of aluminum and metallic elements of Groups IVB, VB and VIB of the Periodic Table and one or more non-metallic elements selected from Groups IIIA, IVA, VA and VIA of the Periodic Table. Outer layer(s) over the refractory layer can comprise a carbide, nitride, carbonitride, oxycarbonitride, oxide or boride of one or more metallic elements selected from the group consisting of aluminum and metallic elements of Groups IVB, VB and VIB of the Periodic Table. For example, one or more outer layers are selected from the group consisting of titanium nitride, titanium carbonitride, titanium oxycarbonitride, titanium carbide, zirconium nitride, zirconium carbonitride, hafnium nitride, hafnium carbonitride and alumina and mixtures thereof.

Outer layers of coatings described herein can have any thickness not inconsistent with the objectives of the present invention. A coating outer layer, in some embodiments, can have a thickness ranging from 0.2 µm to 5 µm.

Coatings described herein can be subjected to post-coat treatments. Coatings, for example, can be blasted with various wet and/or dry particle compositions. Post coat blasting can be administered in any desired manner. In some embodiments, post coat blasting comprises shot blasting or pressure blasting. Pressure blasting can be administered in a variety of forms including compressed air blasting, wet compressed air blasting, pressurized liquid blasting, wet blasting and steam blasting. Wet blasting, for example, is accomplished using a slurry of inorganic and/or ceramic particles, such as alumina, and water. The alumina particle slurry can be pneumatically projected at a surface of the coated cutting tool body to impinge on the surface of the coating. The alumina particles can generally range in size between about 20 µm and about 100 µm.

Blasting parameters include pressure, angle of impingement, distance to the part surface and duration. In some embodiments, angle of impingement can range from about 10 degrees to about 90 degrees, i.e., the particles impinge the coating surface at an angle ranging from about 10 degrees to about 90 degrees. Suitable pressures can range from 30-55 pounds per square inch (psi) at a distance to the coated surface of 1-6 inches. Further, duration of the blasting can generally range from 1-10 seconds or longer. Blasting can be generally administered over the surface area of the coating or can be applied to select locations such as in a workpiece contact area of the cutting tool. A workpiece contact area can be a honed region of the cutting tool.

In other embodiments, a coating is subjected to a polishing post-coat treatment. Polishing can be administered with paste of appropriate diamond or ceramic grit size. Grit size of the paste, in some embodiments, ranges from 1 µm to 10 µm. In one embodiment, a 5-10 µm diamond grit paste is used to polish the coating. Further, grit paste can be applied to the CVD coating by any apparatus not inconsistent with the objectives of the present invention, such as brushes. In one embodiment, for example, a flat brush is used to apply grit paste to the CVD coating in a workpiece contact area of the cutting tool.

A coating described herein can be blasted or polished for a time period sufficient to achieve a desired surface roughness ($R_a$) and/or other parameters such as reducing residual tensile stress in the coating. In some embodiments, a coating subjected to post-coat treatment has a surface roughness ($R_a$) selected from Table IV.

TABLE IV

Post-Coat Surface Roughness ($R_a$)
Coating Surface Roughness ($R_a$) - nm

≤500
≤250
<200
10-250
50-175
25-150

Coating surface roughness can be determined by optical profilometry using WYKO® NT-Series Optical Profilers commercially available from Veeco Instruments, Inc. of Plainview, N.Y.

Further, a post-coat treatment, in some embodiments, does not remove one or more outer layers of the coating. In some embodiments, for example, a post-coat treatment does not remove an outer layer of TiN, TiCN and/or TiOCN. Alternatively, a post-coat treatment can remove or partially remove one or more outer layers, such as TiN, TiCN and TiOCN.

A coating described herein comprising a refractory layer having a plurality of sublayer groups has nanohardness of at least 23 GPa. In some embodiments, the coating has a nanohardness of 23 GPa to 35 GPa. Coating nanohardness can be in the as-deposited state. Alternatively, the nanohardness can reflect a blasted or polished condition of the coating. Coating nanohardness values recited herein were determined from nano-indentation testing conducted with a Fischerscope HM2000 in accordance with ISO standard 14577 using a Vickers indenter. Indentation depth was set to 0.2 μm.

As described herein, the refractory layer formed of the sublayer groups is deposited by CVD. The Group IVB metal nitride sublayer, for example, can be deposited from a gaseous mixture comprising $H_2$, $N_2$ and gaseous reactant containing the Group IVB metal. In some embodiments, the gaseous reactant is metal chloride, such as $MCl_4$, wherein M is a Group IVB metal.

General CVD processing parameters for a Group IVB metal nitride sublayer having a plurality of nodules is provided in Table V.

TABLE V

Group IVB Metal Nitride Sublayer CVD Processing Parameters

| Process Step | $H_2$ vol. % | $N_2$ vol. % | $MCl_4$ vol. % | Temp. °C. | Pressure torr | Time min. |
|---|---|---|---|---|---|---|
| MN* | Bal. | 12-20 | 0.2-2 | 900-1000 | 40-100 | 5-30 |

*M = Group IVB metal

As described above, the Group IVB metal reactant gas can be ramped or otherwise varied within the parameters of Table V to induce formation of the nodules. Moreover, the remaining nodule formation pathways and/or mechanisms discussed hereinabove may also contribute during deposition of the Group IVB metal nitride sublayer.

The alumina sublayer adjacent to the Group IVB metal nitride sublayer can be deposited from a gaseous mixture of $AlCl_3$, $H_2$, $CO_2$, HCl and optionally $H_2S$. General CVD processing parameters for depositing an alumina sublayer are provided in Table VI.

TABLE VI

Alumina Sublayer CVD Processing Parameters

| Process Step | $H_2$ vol. % | $AlCl_3$ vol. % | $CO_2$ vol. % | CO vol. % | $H_2S$ vol. % | HCl vol. % | Temperature °C. | Pressure torr | Time min. |
|---|---|---|---|---|---|---|---|---|---|
| $Al_2O_3$ | Bal. | 1-5 | 0.5-6 | — | 0.05-0.6 | 1-5 | 950-1050 | 30-120 | 6-200 |

The refractory layer can be deposited directly on the substrate surface. Alternatively, a plurality of coating inner layers can reside between the substrate and refractory layer. General CVD deposition parameters for various inner layers are provided in Table VII.

TABLE VII

CVD Parameters for Inner layer Deposition

| Base Layer Composition | Gas Mixture | Temperature °C. | Pressure torr | Duration min. |
|---|---|---|---|---|
| TiN | $H_2$, $N_2$, $TiCl_4$ | 800-900 | 45-70 | 10-90 |
| MT-TiCN | $H_2$, $N_2$, $TiCl_4$, $CH_3CN$ | 750-900 | 50-75 | 50-400 |
| HT-TiCN | $H_2$, $N_2$, $TiCl_4$, $CH_4$ | 900-1050 | 45-120 | 30-200 |
| TiOCN | $H_2$, $N_2$, $TiCl_4$, $CH_4$, CO | 900-1050 | 150-400 | 30-70 |

The foregoing general CVD parameters for inner layer deposition, in some embodiments, can be applied for deposition of one or more outer layers over the refractory layer.

These and other embodiments are further illustrated in the following non-limiting examples.

Example 1

Coated Cutting Tools

Coated cutting tools described herein were produced by placing cemented tungsten carbide (WC—Co) cutting insert substrates [ANSI standard geometry CNMG432RN] into an axial flow hot-wall CVD reactor. The cutting inserts comprised 6 wt. % cobalt binder with the balance WC grains of size 1-5 μm. A coating including a refractory layer comprising a plurality of sublayer groups was deposited on the cutting inserts according to Tables VIII and IX. Specifically, the refractory layers were formed of 64 sublayer groups, each sublayer group comprising a TiN sublayer and an alumina sublayer, wherein the TiN sublayer comprised nodules of TiN interfacing with the alumina sublayer. Each alumina sublayer had a thickness of approximately 40-100 nm, and each TiN sublayer had a thickness of approximately 20-40 nm. The refractory layer morphology was consistent with the cross-sectional SEMs provided in FIGS. 3 and 4 discussed above. Depositions of the alumina sublayers and TiN sublayers were administered in alternating fashion to form the refractory layer. An outer layer of TiN was deposited over the refractory layer to complete the coating.

TABLE VIII

CVD Deposition Steps of Coating

| Process Step | $H_2$ vol. % | $N_2$ vol. % | $TiCl_4$ vol. % | $CH_3CN$ vol. % | $CH_4$ vol. % | $AlCl_3$ vol. % | $CO_2$ vol. % | CO vol. % | $H_2S$ vol. % | HCl vol. % |
|---|---|---|---|---|---|---|---|---|---|---|
| TiN | Bal. | 18.40 | 0.95 | — | — | — | — | — | — | — |
| MT-TiCN | Bal. | 27.8 | 1.31 | 0.001 | — | — | — | — | — | 1.40 |
| HT-TiCN | Bal. | 16.69 | 0.76 | — | 3.70 | — | — | — | — | — |
| TiOCN | Bal. | 17.50 | 1.08 | — | 2.52 | — | — | 1.10 | — | 1.10 |
| $Al_2O_3$* | Bal. | — | — | — | — | 4.84 | 2.42 | — | 0.10 | 3.00 |
| MN* | Bal. | 18.00 | 0.95 | — | — | — | — | — | — | — |
| TiN | Bal. | 26.00 | 0.80 | — | — | — | — | — | — | 0.72 |

*Alternating Deposition to form sublayer groups

TABLE IX

CVD Deposition Steps

| Process Step | Temp. ° C. | Pressure torr | Time min. |
|---|---|---|---|
| TiN | 850-960 | 45-70 | 10-90 |
| MT-TiCN | 900-940 | 50-75 | 50-400 |
| HT-TiCN | 900-1050 | 45-120 | 30-200 |
| TiOCN | 950-1050 | 150-400 | 30-70 |
| $Al_2O_3$* | 950-1050 | 30-120 | 6-200* |
| TiN* | 900-1000 | 40-100 | 5-30* |
| TiN** | 850-960 | 45-70 | 10-200 |

*Per sublayer deposition
**Outer layer

The resulting multilayer coating exhibited the properties provided in Table X.

TABLE X

Properties of CVD Coating

| Coating Layers | Thickness (μm) |
|---|---|
| TiN | 0.5 |
| MT-TiCN | 9.0 |
| HT-TiCN | 0.8 |
| $[Al_2O_3/TiN]_{64}$ | 11.2 |
| TiN | 1.5 |

Example 2

Coating Hardness

Coated cutting tools of Example 1 were subjected to nanohardness testing. Nanohardness was determined from nano-indentation testing conducted with a Fischerscope HM2000 in accordance with ISO standard 14577 using a Vickers indenter. Indentation depth was set to 0.2 μm. Nanohardness was determined for coated cutting tools of Example 1 in the as-deposited state and blasted state. Post-coat blasting was administered with an alumina particle slurry for 3-5 seconds with three nozzles. The nozzles provided angles of impingement of 10, 40 and 80 degrees. Blasting removed the outermost TiN layer of the coating. Nanohardness was also determined for comparative cutting inserts of identical ANSI geometry having a CVD coating detailed in Table XI (Comparative 1).

TABLE XI

Comparative Cutting Insert CVD Coating

| Coating Layers | Thickness (nm) |
|---|---|
| TiN | 0.4 |
| MT-TiCN | 10.2 |
| HT-TiCN | 0.9 |
| α-$Al_2O_3$ | 8.4 |
| TiN | 1.5 |

Nanohardness was determined for the Comparative cutting inserts in the as-deposited state and blasted state. Blasting conditions for the Comparative cutting inserts were the same as that employed for the cutting inserts of Example 1. The results of the nanohardness testing are provided in Table XII.

TABLE XII

CVD Coating Nanohardness

| Cutting Insert | Nanohardness (GPa) |
|---|---|
| Example 1—as deposited | 29.5 |
| Comparative 1—as deposited | 26 |
| Example 1—wet blasted | 33.5 |
| Comparative 1—wet blasted | 27 |

Example 3

Metal Cutting Testing

Coated cutting inserts of Example 1 and Comparative cutting inserts (1 and 2) were subjected to continuous turning testing according to the parameters below. Comparative 1 exhibited the CVD coating architecture in Table XI above. Comparative 2 employed a cemented carbide substrate consistent with the Example 1 and Comparative 1 and was provided the CVD coating detailed in Table XIII.

TABLE XIII

CVD Coating of Comparative Insert 2

| Coating Layers | Thickness (μm) |
|---|---|
| TiN | 0.5 |
| MT-TiCN | 10.2 |
| HT-TiCN | 1.0 |
| $[Al_2O_3/TiOCN]_{64}$ | 10.0 |
| TiN | 1.2 |

As provided in Table XIII, the CVD coating of Comparative 2 included a refractory layer having multilayer architecture. The refractory layer, however, did not include sublayers having nodules as provided by the TiN sublayers of Example 1. For the turning testing, two separate cutting inserts were tested for each coating architecture of Example 1, Comparative 1 and Comparative 2 to generate repetition 1, repetition 2 and mean cutting lifetime.

Turning Parameters
Workpiece: 1045 Steel
Speed: 1100 sfm
Feed Rate: 0.012 ipr
Depth of Cut: 0.08 in
Lead Angle: −5°
End of Life was registered by one or more failure modes of:
Uniform Wear (UW) of 0.012 inches
Max Wear (MW) of 0.012 inches
Nose Wear (NW) of 0.012 inches
Depth of Cut Notch Wear (DOCN) of 0.012 inches
Trailing Edge Wear (TW) of 0.012 inches
The results of the continuous turning testing are provided in Table XIV.

TABLE XIV

Continuous Turning Testing Results

| Coated Cutting Insert | Repetition 1 Lifetime (min.) | Repetition 2 Lifetime (min) | Mean Cutting Lifetime (min.) |
|---|---|---|---|
| Example 1 | 11.9 | 12.8 | 12.35 |
| Comparative 1 | 11.6 | 11.3 | 11.45 |
| Comparative 2 | 8.4 | 7.6 | 8.0 |

As provided in Table XIV, the coated cutting insert of Example 1 having an inter-anchored CVD coating architecture described herein outperformed Comparative inserts 1 and 2.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A coated article comprising:
a substrate; and
a coating deposited by chemical vapor deposition (CVD) adhered to the substrate, the coating including a refractory layer comprising a plurality of sublayer groups, a sublayer group comprising a Group IVB metal nitride sublayer and an adjacent alumina sublayer, the Group IVB metal nitride sublayer comprising a plurality of Group IVB metal nitride nodules interfacing with the alumina sublayer.

2. The coated article of claim 1, wherein the sublayer groups are adjacent to one another in the refractory layer.

3. The coated article of claim 1, wherein the Group IVB metal nitride sublayer is a nanolayer.

4. The coated article of claim 3, wherein the Group IVB metal nitride sublayer has a thickness of 3 nm to 100 nm.

5. The coated article of claim 1, wherein nodules of the Group IVB metal nitride sublayer have a size less than 1 μm.

6. The coated article of claim 5, wherein the nodules have a size of 20 nm to 500 nm.

7. The coated article of claim 1, wherein the alumina sublayer is a nanolayer.

8. The coated article of claim 7, wherein the alumina sublayer has a thickness less than 0.5 μm.

9. The coated article of claim 7, wherein the alumina sublayer has a thickness of 0.005 μm to 0.1 μm.

10. The coated article of claim 1, wherein the Group IVB metal nitride sublayer and the adjacent alumina sublayer of the sublayer group are nanolayers.

11. The coated article of claim 1, wherein the refractory layer has thickness of 0.05 μm to 20 μm.

12. The coated article of claim 1, wherein the nodules are distributed along surfaces of the Group IVB metal nitride sublayer.

13. The coated article of claim 2, wherein nodules of a Group IVB metal nitride sublayer interface with alumina sublayers of adjacent sublayer groups.

14. The coated article of claim 1, wherein the alumina sublayer has an average grain size less than 100 nm.

15. The coated article of claim 1, wherein the CVD coating has nanohardness of up to 35 GPa.

16. The coated article of claim 1, wherein the CVD coating has a nanohardness of 23 GPa to 35 GPa.

17. The coated article of claim 1 further comprising one or more inner layers between the refractory layer and the substrate, an inner layer comprising one or more metallic elements selected from the group consisting of aluminum and metallic elements of Groups IVB, VB and VIB of the Periodic Table and one or more non-metallic elements of Groups IIIA, VI, VA and VIA of the Periodic Table.

18. The coated article of claim 1 further comprising one or more outer layers over the refractory layer, an outer layer comprising one or more metallic elements selected from the group consisting of aluminum and metallic elements of Groups IVB, VB and VIB of the Periodic Table and one or more non-metallic elements of Groups IIIA, VI, VA and VIA of the Periodic Table.

19. The coated article of claim 1, wherein the substrate is cemented carbide, carbide, ceramic, cermet or steel.

20. The coated article of claim 1, wherein the Group IVB metal nitride sublayer is titanium nitride.

21. The coated article of claim 20, wherein the Group IVB metal nitride nodules are titanium nitride.

\* \* \* \* \*